(12) United States Patent
Sherry

(10) Patent No.: US 8,354,854 B2
(45) Date of Patent: Jan. 15, 2013

(54) MICROCIRCUIT TESTING INTERFACE HAVING KELVIN AND SIGNAL CONTACTS WITHIN A SINGLE SLOT

(75) Inventor: Jeffrey C. Sherry, Savage, MN (US)

(73) Assignee: Johnstech International Corporation, Minneapolis, MN (US)

( * ) Notice: Subject to any disclaimer, the term of this patent is extended or adjusted under 35 U.S.C. 154(b) by 509 days.

(21) Appl. No.: 12/521,843

(22) PCT Filed: Jan. 2, 2008

(86) PCT No.: PCT/US2008/050044
§ 371 (c)(1),
(2), (4) Date: Feb. 22, 2010

(87) PCT Pub. No.: WO2008/083404
PCT Pub. Date: Jul. 10, 2008

(65) Prior Publication Data
US 2010/0134119 A1      Jun. 3, 2010

Related U.S. Application Data

(60) Provisional application No. 60/883,128, filed on Jan. 2, 2007.

(51) Int. Cl.
*G01R 31/02* (2006.01)
*G01R 31/28* (2006.01)

(52) U.S. Cl. ......... 324/755.01; 324/750.24; 324/754.01; 324/764.03; 324/755.08; 439/65; 439/76.1; 439/81

(58) Field of Classification Search ..... 324/537–762.05; 439/55–85, 90
See application file for complete search history.

(56) References Cited

U.S. PATENT DOCUMENTS

| | | | |
|---|---|---|---|
| 5,967,848 | A | 10/1999 | Johnson et al. |
| 7,074,049 | B2 | 7/2006 | O'Sullivan et al. |
| 7,255,576 | B2 * | 8/2007 | O'Sullivan et al. ............. 439/72 |
| 7,825,676 | B2 * | 11/2010 | Koizumi et al. ......... 324/750.16 |
| 2006/0087311 | A1 * | 4/2006 | Shell .......................... 324/158.1 |

\* cited by examiner

*Primary Examiner* — Melissa Koval
*Assistant Examiner* — Emily Chan
(74) *Attorney, Agent, or Firm* — Nawrocki, Rooney & Sivertson, P.A.

(57) ABSTRACT

In a first slot of a plurality of adjacent slots in alignment with traces on a load board of a tester, first and second conductor layers, each to make electrical contact with both a load board trace and a DUT lead. Each of the first and second contacts receives force from a resilient element extending across the slots and that urges a contact point on the contact against at least one trace and a DUT lead. Insulation between said first and second contacts in the first slot electrically insulates the first and second contacts from each other within the first slot.

9 Claims, 3 Drawing Sheets

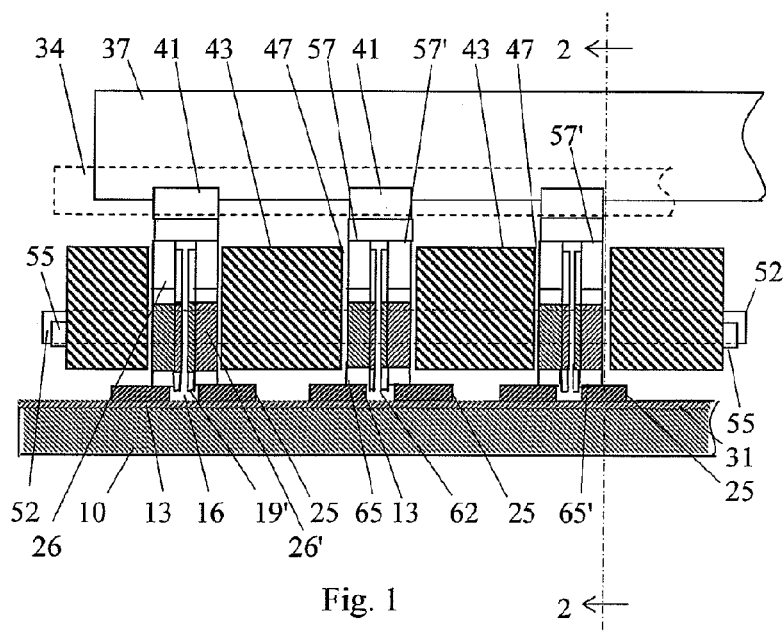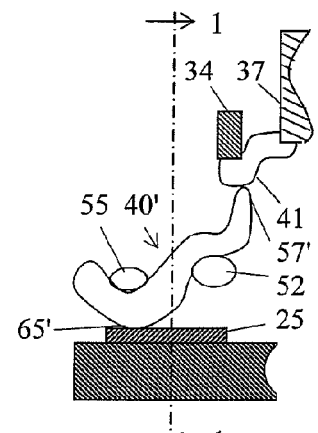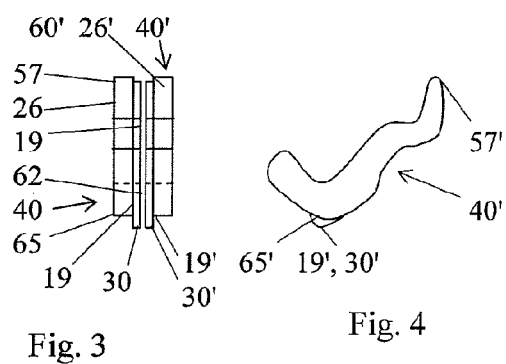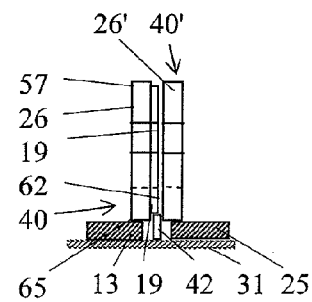
Fig. 1
Fig. 2
Fig. 3
Fig. 4
Fig. 5

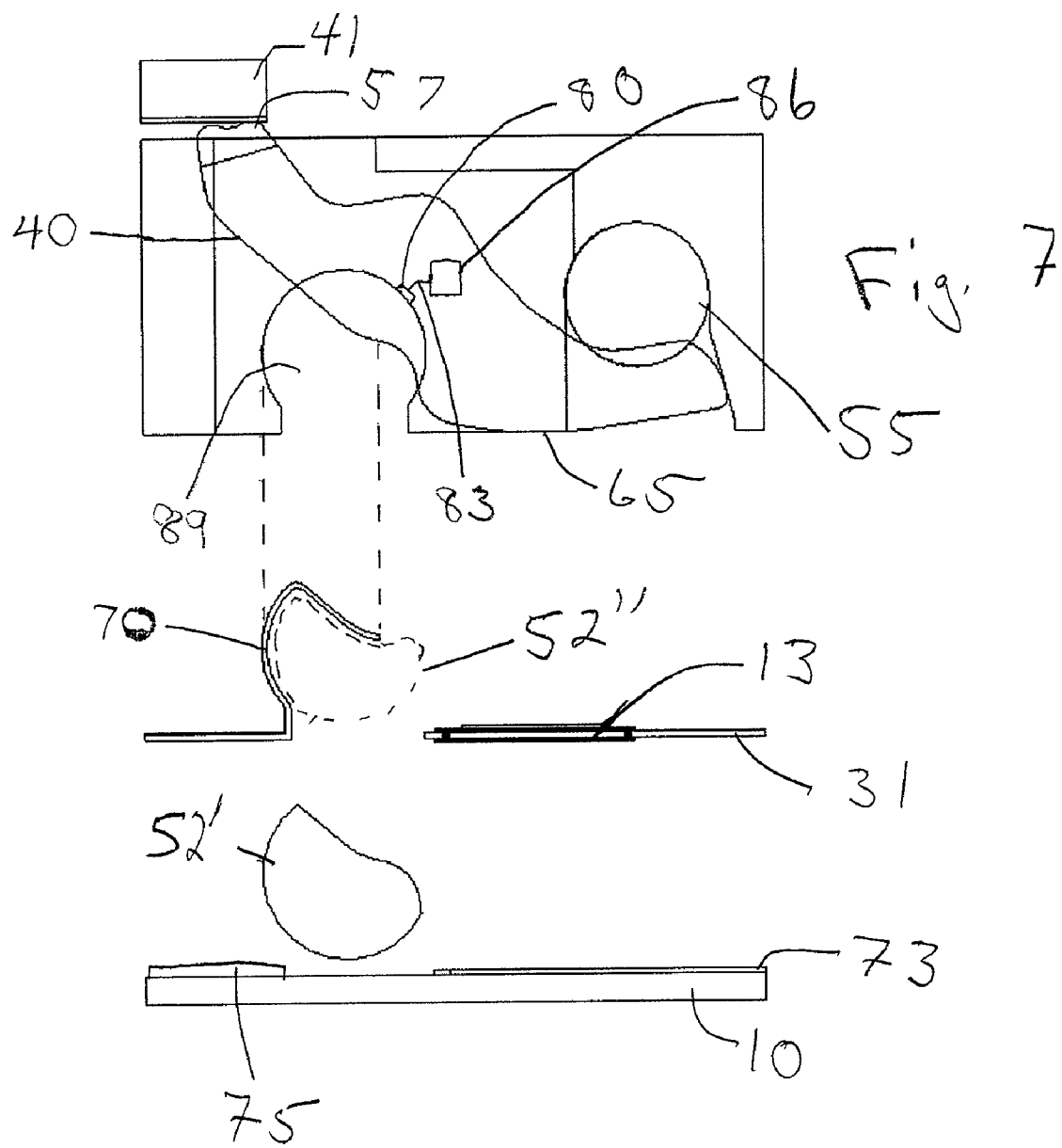

MICROCIRCUIT TESTING INTERFACE HAVING KELVIN AND SIGNAL CONTACTS WITHIN A SINGLE SLOT

CROSS REFERENCE TO RELATED APPLICATIONS

This is an international application filed under 35 USC §363, claiming priority under 35 USC §119(e) of U.S. Prov. Appl. No. 60/883,128 filed Jan. 2, 2007.

BACKGROUND OF THE INVENTION

The invention pertains to improvements to equipment for testing microcircuits. This is important because the manufacturing processes for microcircuits cannot guarantee that every microcircuit is free of defects. Dimensions of the contacts or leads for the individual microcircuits are microscopic, on the order of tenths of a mm., and process steps very numerous and complex, so small or subtle failures in the manufacturing process can often result in defective devices.

Usually (but not always) a microcircuit is mounted within a small plastic housing or package that protects the microcircuit within from damage. The individual microcircuit contacts are connected within the package to leads external to the package. The pitch, or center-to-center spacing of adjacent leads, may be as small as 0.4 mm. for some packages.

A number of different designs exist for the housing or package of the microcircuit. Some have cantilevered leads projecting from the bottom edge of the package. Others have small contacts that are flush with or project only slightly from the package surface. The leads of others are small solder balls that are melted during installation on a circuit board. In any case, the usual practice is to solder each of the many leads of a package to a larger circuit board that provides for connections to switches and other discrete components, transducers such as speakers, etc. A circuit board often interconnects a number of microcircuits as well.

Mounting a defective microcircuit on a circuit board is relatively costly. Once soldered to a circuit board, removing a microcircuit is problematic because the very act of melting the solder for a second time may ruin the circuit board. Thus, if the microcircuit is defective, the circuit board itself is probably ruined as well, meaning that the entire present value of the circuit board is lost. Even if it is possible to remove a defective microcircuit, detecting which of perhaps several is defective is difficult and expensive. For all these reasons, a microcircuit is usually tested before installation on a circuit board.

Each microcircuit must be tested in a way that identifies a very high percentage of the defective microcircuits, but yet does not improperly identify more than a small percentage of good microcircuits as defective. Failure to identify defective microcircuits in particular adds substantial overall cost to the final product. Wrongly identifying good microcircuits as defective if frequent, can also add significant costs to microcircuit production.

The need to accurately test microcircuits has led to the development of dedicated equipment for testing microcircuits. Reliable test equipment faces a number of challenges that makes the test equipment itself quite complex. First of all, the test equipment must make accurate, low resistance, temporary electrical contact with each of the closely spaced microcircuit leads without damaging either the leads or the microcircuit. Because of the small size of microcircuit leads and the spacing between the leads, even small alignment errors in making the contact will result in incorrect connections. Connections to the microcircuit that are misaligned or otherwise incorrect will cause the test equipment to identify the device under test (DUT) as defective, even though the reason for the failure is the incorrect electrical connection between the test equipment and the DUT rather than defects in the DUT itself.

Test equipment in current use has an array of test contacts that match the pattern of the microcircuit lead array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths, also known as traces, that carry the signals and power between the test equipment electronics and the test contacts.

A certain type of common test contact has the form of a thin, elongate lever or arm in a stylized S shape. U.S. Pat. No. 5,967,848 shows test contacts of this type, see FIG. 6 therein for example. In use, a point near one end of each test contact rests on a load board contact. A point near the other end of each test contact rests on a DUT lead. A guide has walls that define a set of side-by-side slots that holds these test contacts in alignment with the DUT leads and the traces. The pitch of the slots is chosen to align the individual slots with the DUT leads.

The levers are held in place within the slots by retaining pins or bars made of a resilient material such as an elastomer. The retaining bars pass through holes in the walls defining the guide's slots to fit inside the curves defined by the S shape of the levers. The '848 patent shows how the elastomeric bars intercept the levers. The resiliency in the retaining bars provides compliance in the positioning of the lever contacts when a presser foot presses an array of DUT leads against the lever contacts. The retaining bars deform in shear slightly to provide consistent force between each contact lever and its associated load board contact and DUT lead.

One problem that arises in microcircuit testing is the potential for electrical resistance between the lead and its test contact. When this resistance is too high, signals that the microcircuit produces during the test may appear to be too low. That DUT may then be rejected as faulty even though the problem is actually a poor contact between a DUT lead and the test contact. This poor contact is strictly an artifact of the testing and is unlikely to be present once the DUT has been soldered onto a circuit board.

"Kelvin" testing refers to a process where the test equipment provides two test contacts, often referred to as "force" and "sense" contacts, for each DUT lead. The force contact carries the signal to or from the DUT for testing DUT operation, and can also be called the signal contact. The sense contact carries the Kelvin signal for assuring that the contact to DUT lead is good, and can also be called the Kelvin contact.

A preliminary part of the test procedure measures the resistance between the two test contacts. If this value is high, one or both of the two test contacts are not making good electrical contact to the microcircuit terminal. If the possibility of high resistance at this interface will affect the accuracy of the actual testing of the microcircuit performance, then the issue can be addressed according to the provisions of the testing protocol. For example, a Kelvin test failure may suggest that the operator should adjust the test equipment or replace the test contact.

Kelvin testing provides additional assurance that each test contact has made good electrical connection with a DUT lead.

When the Kelvin test shows good contact at each DUT lead, then it is reasonable to conclude that a failure in the remainder of the test resulted from a defective DUT. Thus, a Kelvin test often eliminates falsely detecting that a DUT is defective.

U.S. Pat. No. 5,967,848 shows lever-type contacts that have on the sides thereof, electrical components such as capacitors, inductors, transistors, and even microcircuits. These components can for example be used to match impedances of a microcircuit lead and the load board circuitry to which it is connected.

BRIEF DESCRIPTION OF THE INVENTION

The invention is for use in a microcircuit tester of the type having i) a load board supporting a plurality of traces arranged in a predetermined pattern and for connection to circuitry for testing operation of a microcircuit comprising a device under test (DUT), ii) a test contact guide having a plurality of adjacent planar slots in alignment with the traces, each for receiving a contact element for electrically connecting a lead on a DUT to a trace on a load board, and iii) a resilient element within the slots.

The invention itself comprises in a first slot, first and second conductor layers each to make electrical contact with both a load board trace and a DUT lead. Each of the first and second contacts receives force from the resilient element that urges a contact point on the contact against at least one of a trace and a DUT lead. Insulation between the first and second contacts in the first slot electrically insulates the first and second contacts from each other within the first slot.

The insulation layer may attach to either contact. Or, two contact layers may be provided, one attached to a facing surface of each contact.

BRIEF DESCRIPTION OF THE DRAWINGS

FIGS. 1 and 2 are front and side section views of portions of a guide with pairs of contacts in the slots of the guide.

FIG. 3 is a front elevation view of a pair of contacts in the position relative to each other they will occupy in a guide slot.

FIG. 4 is a side elevation view of a contact in horizontal alignment with FIG. 3.

FIG. 5 is a variation on the structure of the contact pair.

FIG. 7 is an exploded side view of the variation of the invention shown in FIG. 6.

DESCRIPTION OF THE PREFERRED EMBODIMENTS

Figure 6:
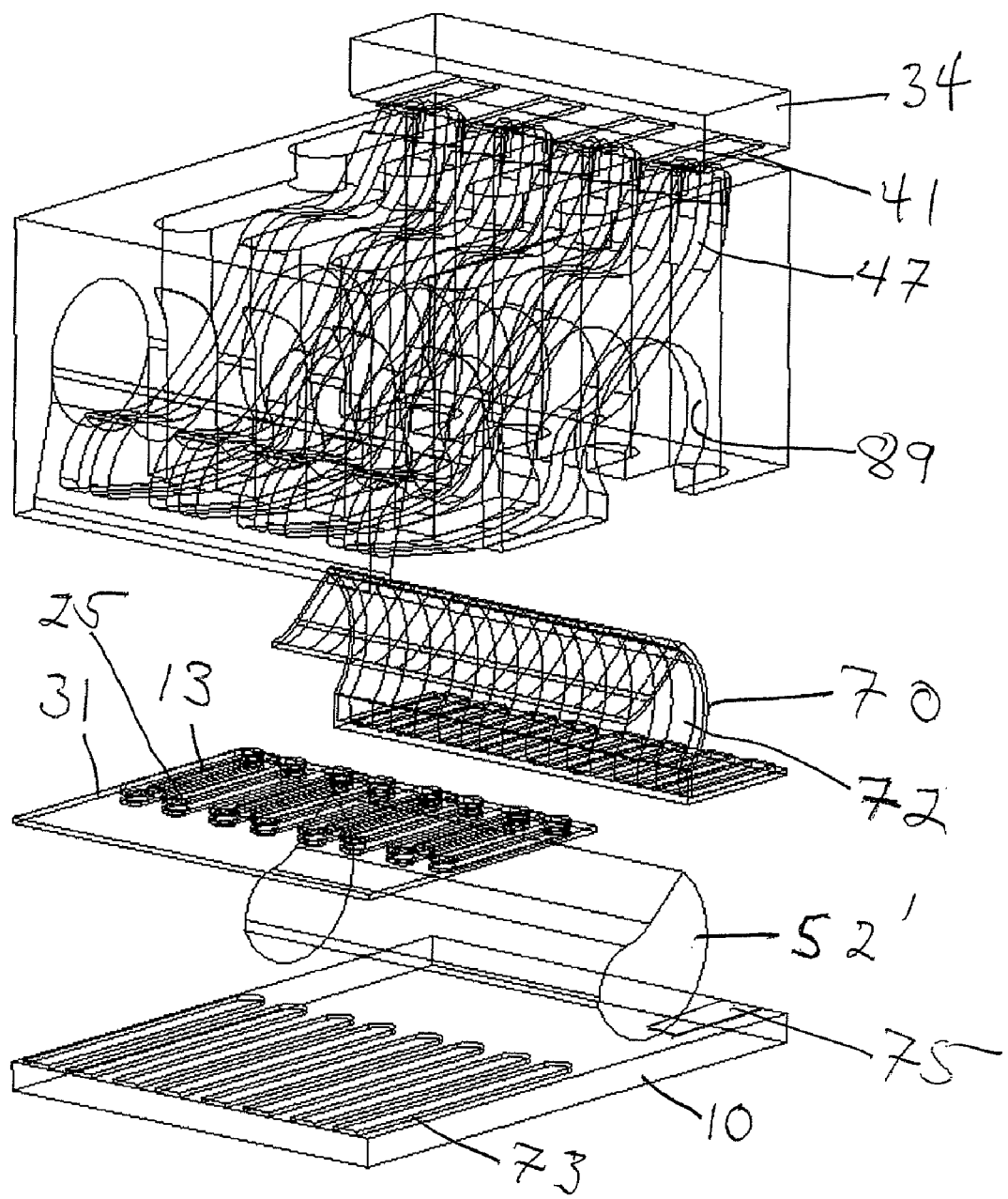
FIG. 6 is a wire frame perspective of a variation of the invention of FIGS. 1-4.

FIGS. 1 and 2 should be considered together, and show portions of the interconnection between a microcircuit package 37 (the DUT) and traces 13 and 25 on a load board 10 for temporary use during testing of the microcircuit. For ease of replacement, traces 13 and 25 may be carried on a membrane 31 lying on and electrically interconnecting with load board 10.

The microcircuit package 37 has a number of leads 41 projecting outwardly from the walls of package 37. These leads will be soldered to pads on a circuit board when package 37 is installed. FIGS. 1 and 2 are not to scale so as to better show the structural relationships among the various features. Note also that clearances between various elements of the invention are exaggerated to allow better understanding of the invention.

Contact elements 40 and 40' are supported by a contact guide, relevant portions of which are shown in FIGS. 1 and 2 as including walls 43 defining between them individual slots 47. Each slot 47 holds a pair of contact elements 40 and 40'. A presser bar 34 shown in phantom in FIG. 1 applies pressure to stabilize the position of each lead 41 against force provided by individual contact elements 40 and 40'.

The structure shown in FIGS. 1 and 2 forms a Kelvin contact configuration. Contact elements 40 and 40' have conductor layers 26 and 26' that make the electrical connections between a single lead 41 and traces 13 and 25 on load board 10. Contact element 40 may function as a test contact, and contact element 40' may function as a Kelvin contact. Traces 13 and 25 respectively make the test and Kelvin connections from contact elements 40 and 40' to the test circuitry.

Resilient elastomeric cylinders 52 and 55 are held in parallel holes or passages extending transversely through all of the individual walls 43 and slots 47. The size and stiffness of cylinders 52 and 55, their positions within slots 47, and the shape and dimensions of contact elements 40 and 40' cooperate to cause a slight distortion or deflection of cylinders 52 and 55 within walls 43 and slots 47.

One can see that the result of this distortion is a pair of oppositely directed forces, in effect a couple, urging contact elements 40 and 40' to rotate in a counterclockwise direction (as viewed in FIG. 2). This counterclockwise-directed rotation resiliently presses each pair of contact points 57 against a lead 41 and each pair of contact points 65 and 65' respectively against traces 13 and 25. Lead 41 and traces 13 and 25 urge clockwise rotation of contact elements 40 and 40', to thereby create contact force for good electrical connection. Presser bar 34 limits the deflection of individual leads 41 from the force applied by contact elements 40 and 40'.

FIG. 3 shows an edge view of a pair of contact elements 40 and 40' having in this particular configuration insulating layers 19 and 19' attached respectively to conductor layers 26 and 26'. Many other configurations are possible, such as omitting one of the insulating layers 19 and 19'. Similarly, the projective shape and dimensions of a contact element 40 or 40' as shown in FIGS. 2 and 4 can vary considerably depending for example on the force required for proper electrical contact to the traces 13 and 25 and the leads 41.

Each conductor layer 26 and 26' has lead contact points 57 and 57' that make the electrical and mechanical contact with a lead 41. Each conductor element 26 and 26' also has trace contact points 65 and 65' that make electrical and mechanical contact with a set of traces 13 and 25.

Insulating layers 19 and 19' preferably have low friction facing surfaces to allow independent sliding or shifting of contact elements 40 and 40' with respect to each other. The surfaces of leads 41 facing contact points 57 and 57' typically vary slightly in terms of elevation or spacing from contact points 57 and 57'. The ability of each contact element 40 and 40' to slip freely with respect to each other in a slot 47 accommodates these variations in the elevation of an individual lead 41 surface.

Insulating layers 19 and 19' preferably are recessed slightly relative to conductor layers 26 and 26' in the vicinity of lead contact points 57 and 57' so that say, contaminants between conductor layers 26 and 26', will not interfere with the electrical connections to lead 41.

Insulating layers 19 and 19' have projections 30 and 30' that extend past the conductor layers 26 and 26' in the vicinity of contact points 65 and 65'. Projections 30 and 30' form features on contact elements 40 and 40' that cooperate with a feature on load board 10 to provide an alignment function that holds contact elements 40 and 40' in proper position on each set of traces 13 and 25.

FIG. 1 shows one form of a cooperating feature on load board 10 as comprising a slot or void 16 between traces 13 and 25 into which projections 30 and 30' fit. Projections 30 and 30' hold contact elements 40 and 40' in proper relationship to traces 13 and 25 so that conductor layers 26 and 26' make good electrical contact with traces 13 and 25.

It is trivial to reverse the placement of the void and projection. The void may comprise a recess between contacts 40 and 40', with the projection extending from between traces 13 and 25 into that recess between contact element 40 and 40'. The two embodiments are conceptually fully equivalent.

FIG. 5 shows such an arrangement. A projection 42 carried on membrane 31 extends into a recess between conductive layers 26 and 26', to improve alignment of contact elements 40 and 40' with traces 13 and 25.

FIG. 5 also shows contact elements 40 and 40' as having only a single insulating layer 19, which is often valuable because slot width is not large.

The wire frame view of the invention in FIG. 6 and the exploded side view in FIG. 7 add a feature of providing an alternate connection from the load board 10 to individual contacts 40 and 40'. This may have value for example if contact elements 40 or 40' carry active electrical components. The reference numbering is consistent throughout the Figs. of this description.

In FIG. 6, a membrane or ribbon connector 70 makes electrical connection to load board contacts 75 through conducting paths 72. Elastomeric cylinder 52' fits within a passage 89 extending transversely through all of the slots 47 holding the pairs of contact elements 40 and 40'. FIG. 7 shows cylinder 52' in phantom outline 52'' and illustrates how membrane fits around elastomeric cylinder 52'. Connector 70 fits around a portion of the periphery of passage 89 and extends between cylinder 52' and contact elements 40 and 40'.

Referring to FIG. 7, contact element 40 includes a contact pad 80 on the edge thereof and adjacent to membrane 70. Contact element 40 makes electrical contact through contact pad 80 with an individual path 72 that cylinder 52' presses against element 40. Path 72 may conduct voltage through a path 83 on contact element 40 to an active component 86 carried by the contact element 40.

FIGS. 6 and 7 are conceptual, in that they show only one connection through membrane connector 70 to contact element 40. However, providing for two or more paths 72 to a single contact element 40 is simple. This will provide the option of power for an active component 86 directly on the contact element 40, and directly in the path carrying the signal from lead 41 to load board contact 13.

In a structure such as FIGS. 6 and 7 shows, contact elements 40 and 40' may comprise a silicon substrate having photolithographically formed electrical components and electrical connections. Thus, active component 80 may comprise a transistor or even a microcircuit.

What is claimed is:

1. In a microcircuit test interface having i) a load board supporting a plurality of traces arranged in a predetermined pattern and for connection to circuitry for testing operation of a microcircuit comprising a device under test (DUT) having a plurality of leads, ii) a test contact guide having a plurality of adjacent planar slots in alignment with the traces, each for receiving a contact element for electrically connecting a lead on a DUT to a trace on a load board, iii) a resilient element within the slots, and iv) first and second rigid conductor layers in at least one slot of the test contact guide and slidable therein, said first and second conductor layers each to make electrical contact with both a load board trace and a DUT lead, each of the first and second conductor layers receiving force from the resilient element urging a contact point on each of the conductor layers into direct mechanical and electrical contact with both a trace and a DUT lead, and an insulation layer between said first and second contacts in the at least one slot, said insulation layer electrically insulating the first and second conductor layers from each other within the at least one slot, wherein contact points on the conductor layers press against a lead on the DUT, and wherein the insulation layer is recessed relative to those contact points pressing against the lead on the DUT.

2. The test interface of claim 1, wherein the conductor layers have facing surfaces, and wherein the insulating layer is attached to a facing surface of at least one of the first and second conductor layers.

3. The test interface of claim 2, wherein the insulating layer is attached to one only of the first and second conductor layers.

4. The test interface of claim 2, wherein an insulating layer is attached to the facing surface of both conductor layers.

5. The test interface of claim 2, wherein the load board has first and second adjacent traces in alignment with the first slot, wherein the contact points on the conductor layers press against the traces, wherein the insulating layer has an alignment feature between the first and second adjacent traces, and wherein the first and second conductor layers have a feature interacting with the alignment feature to align the first and second conductor layers with the first and second traces.

6. The test interface of claim 5, wherein the alignment feature comprises a void between the traces, and wherein the insulating layer projects past the contact points, and into the void between the traces on the load board.

7. The test interface of claim 1, wherein the test contact guide has a passage extending transversely through slots in the guide in which the resilient element fits, and further including a membrane mechanically connected to the load board and extending into the passage to a point between at least a first conductor layer and the resilient element, and carrying a conductor path, said conductor path electrically connected to a conductor on the load board and pressed against the first conductor layer by the resilient element.

8. The test interface of claim 7, wherein the first conductor layer includes a contact pad in mechanical and electrical connection to the conductor path on the membrane.

9. The test interface of claim 8, wherein the contact pad is on an edge of the first conductor layer in facing and adjacent relation to the resilient element.

* * * * *